United States Patent
Obinata et al.

(10) Patent No.: US 6,280,585 B1
(45) Date of Patent: *Aug. 28, 2001

(54) SPUTTERING APPARATUS FOR FILLING PORES OF A CIRCULAR SUBSTRATE

(75) Inventors: Hisaharu Obinata, Susono; Tetsuji Kiyota; Satoru Toyoda, both of Chigasaki; Yoshiyuki Kadokura, Susono, all of (JP)

(73) Assignee: ULVAC, Inc. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/963,197

(22) Filed: Nov. 3, 1997

Related U.S. Application Data

(63) Continuation of application No. 08/458,728, filed on Jun. 2, 1995, now abandoned, which is a continuation of application No. 08/139,723, filed on Oct. 22, 1993, now abandoned.

(30) Foreign Application Priority Data

Oct. 28, 1992 (JP) .................................................. 4-289817
Jun. 30, 1993 (JP) .................................................. 5-162573

(51) Int. Cl.[7] .................................................. C23C 14/34
(52) U.S. Cl. .............................. 204/298.19; 204/298.07; 204/298.12; 204/298.06; 204/298.08; 204/298.09
(58) Field of Search ........................... 204/192.12, 192.3, 204/298.06, 298.08, 298.09, 298.19, 298.2, 298.34, 298.12, 298.07

(56) References Cited

U.S. PATENT DOCUMENTS

| | | | |
|---|---|---|---|
| 3,461,054 | * 8/1969 | Vratny | 204/298.08 |
| 4,756,810 | * 7/1988 | Lamont, Jr. et al. | 204/298.06 |
| 4,853,102 | * 8/1989 | Tateishi et al. | 204/298.06 |
| 4,874,494 | * 10/1989 | Ohmi | 204/298.06 |
| 4,994,162 | * 2/1991 | Armstrong et al. | 204/192.12 |
| 5,330,628 | * 7/1994 | Demaray et al. | 204/298.19 |

OTHER PUBLICATIONS

Declaration of Technical Translator from Translations Branch of U.S. Patent and Trademark Office, Apr. 1999.*

* cited by examiner

Primary Examiner—Rodney G. McDonald
(74) Attorney, Agent, or Firm—Larson & Taylor, PLC

(57) ABSTRACT

A sputtering apparatus in which the distance between a target and a substrate is made to be at least greater than the diameter of the circular substrate wafer and an internal gas pressure level of a vacuum chamber is held to be not higher than $1 \times 10^{-1}$ Pa during sputtering process, thereby capable of effectively filling pores provided on the substrate without generating dust and void spaces.

2 Claims, 5 Drawing Sheets

11

11

SPUTTERING APPARATUS FOR FILLING PORES OF A CIRCULAR SUBSTRATE

This application is a continuation of application Ser. No. 08/458,728 filed Jun. 2, 1995, now abandoned; which is a continuation of 08/139,723 filed Oct. 22, 1993, now abandoned.

BACKGROUND OF THE INVENTION

The present invention relates to a film forming apparatus to be specifically used for filling fine pores of a substrate in the process of manufacturing semiconductors and other electronic devices.

The technology of filling a pore of a thin film with a small piece of metal is taking an ever-increasingly important role in the process of manufacturing semiconductors and other electronic devices. Known techniques that have been used for filling fine pores include sputtering and CVD, of which CVD is particularly suited for filling fine pores of a substrate but a notable disadvantage of this technique is that it cannot be successfully used for metals that would not be gasified. CVD is a technique for forming a film on a substrate by deposition, utilizing chemical reaction of gas, and it operates effectively for filling fine pores. However, preparation of a gaseous material that is chemically active and capable of depositing on a substrate through chemical reaction is prerequisite to the use of CVD. When, for example, causing a TiN film to grow on a Si substrate, it is necessary to form an intermediary Ti film to produce a three-layered structure of TiN/Ti/Si in order to achieve stable and low contact resistivity. However, no gas sources that allow a Ti film to glow have so far been discovered. Thus, preparation of such three-layered structures is currently conducted by sputtering.

With the technique of sputtering, a target made of a material to be used for forming a thin film and a substrate are oppositely arranged in a vacuum chamber, which is supplied with discharge gas and held to a certain reduced internal pressure level, and a negative voltage is applied to the target for electric discharge so that the motion of ionized gas molecules or ions may be accelerated by the negative voltage and they may eventually strike the target and drive out atoms on the surface of the target. Then, while the driven out atoms fly away in different directions according to the cosine rule, some of them will deposit on the substrate to become a thin film.

FIG. 1-A of the accompanying drawings schematically illustrates how atoms driven out of the target get into fine pores 2 of a substrate 1 along various directions as indicated by arrow 3 and settle there in the process of film formation using sputtering. While target atoms obliquely hitting the substrate 1 settle near the opening of each pore, practically no atoms can get to the bottom of the pore as seen from FIG. 1-B. Therefore, if the substrate 1 is heated to cause the formed film to reflow and cover the pore 2, the pore 2 may contain a void space in it as shown in FIG. 1-C. If the substrate 1 is subjected to a biased negative voltage, the formation of a void space in pores may be avoidable as FIG. 1-D shows. All in all, the conventional sputtering technique is necessarily accompanied by the problem of producing void spaces in the substrate.

In a known sputtering apparatus, the distance separating the target and the substrate is normally several centimeters or smaller than the diameter of the substrate, although it may vary depending on the size of the target to be used for sputtering. Consequently, most atoms are made to obliquely hit the substrate to give rise to the above identified problem of producing void spaces.

Referring now to FIG. 2-A of the accompanying drawings, of target atoms obliquely striking the substrate 1, those that are driven out of an end of the target 4 and strike the substrate 1 at the other end of the diagonal line connecting those two ends will be most responsible for the formation of void spaces because the angle of incidence θ becomes smallest for such target atoms. As shown in FIG. 2-B, some of the atoms that hit on the substrate 1 with an angle of incidence θ may reach into the pores 2 of the substrate 1 and those that reach into the pores 2 may predominantly stick to the lateral walls of the pores 2 if the ratio of the depth b to the diameter a of each pore 2, or b/a, and the angle of incidence show a relationship of b/a>tan θ. In other words, the relationship of b/a≤tan θ should hold true in order for a part of the atoms jumping into the pores 2 to be able to successfully reach the bottom.

Some target atoms driven out of the target 4 may collide with gas molecules to change their respective courses before they arrive at the substrate 1. Conventional sputtering apparatuses normally keep the internal gas pressure of the vacuum chamber not lower than $1\times10^{-1}$ Pa for sputtering operation and, under this condition, each of atoms has mean free path of several centimeters which is substantially equal to the distance separating the target and the substrate in the apparatus. This means that an atom emitted from the target 4 may or may not collide with other atom before it gets to the target.

If the mean free path of atoms is smaller than the distance between the target and the substrate, each atom may collide with a plurality of gas molecules before reaching the substrate so that atoms may be dispersed in the vacuum chamber to significantly reduce the rate of forming a film.

In an attempt to solve this problem and effectively fill fine pores of a substrate, U.S. Pat. No. 4824,544 discloses a film forming apparatus in which a filter having a plurality of elongated small bores is arranged between the target and the substrate so as to allow only those gas molecules that are approaching the substrate along a direction perpendicular to the substrate to actually get to the substrate.

With such an apparatus, however, atoms emitted from the target mostly and temporarily adhere to the filter disposed between the target and the substrate and eventually fall on the substrate as dust.

SUMMARY OF THE INVENTION

It is therefore an object of the present invention to provide a film forming apparatus that is free from the above identified problems of conventional sputtering technique in filling fine pores and capable of effectively filling fine pores of a substrate without generating dust.

According to a first aspect of the invention the above object is achieved by providing a film forming apparatus adapted to fill fine pores of a substrate by sputtering comprising a vacuum chamber to be evacuated, supplied with discharge gas and held to an internal gas pressure level not higher than $1\times10^{-1}$ Pa and target and substrate electrodes oppositely arranged in the vacuum chamber and respectively mounted with a target and the substrate separated from each other with a distance at least greater than the diameter of the substrate.

According to a second aspect of the invention, such an apparatus further comprises DC and RF power sources for applying a negative voltage to the target electrode for combined RF-DC sputtering operation.

According to a third aspect of the invention, such an apparatus further comprises substrate heating means arranged at the substrate electrode for heating the substrate.

According to a fourth aspect of the invention, a film forming apparatus as described above with regard to the first aspect of the invention further comprises an RF bias power source for applying an RF bias voltage to the substrate electrode.

According to a fifth aspect of the invention, there is provided a film forming apparatus adapted to fill fine pores of a substrate by sputtering comprising a vacuum chamber to be evacuated, supplied with discharge gas and held to an internal gas pressure level not higher than $1 \times 10^{-1}$ Pa and target and substrate electrodes oppositely arranged in the vacuum chamber and respectively mounted with a target and a substrate arranged so as to hold a relationship of $b/a \leq \tan \theta$, a, b and $\theta$ respectively representing the diameter and the depth of each pore of the substrate and the angle of incidence of each target atom driven out of the target to hit the substrate.

A film forming apparatus according to the fifth aspect of the invention may be appropriately modified by providing it with either DC or RF power sources for applying a negative voltage to the target electrode instead of combined RF-DC sputtering operation, substrate heating means arranged at the substrate electrode for heating the substrate or an RF bias power source for applying an RF bias voltage to the substrate electrode.

Additionally, the distance between the target and the substrate can be determined by taking the diameter of the eroded zone of the target into consideration if they produce difficulties in achieving perpendicular incidence of target atoms.

With a film forming apparatus according to the invention, since the distance between the target and the substrate is made at least greater than the diameter of the substrate, the probability with which atoms driven out of the target strike the substrate with an angle of incidence close to 90° is increased and consequently less atoms settle at and near the opening of each pore of the substrate while more atoms deposit on the bottom of the pore.

Additionally, since the internal gas pressure level of the vacuum chamber of a film forming apparatus according to the invention is held to a level not higher than $1 \times 10^{-1}$ Pa for film formation by sputtering, the mean free path of the atoms is increased to reduce the probability with which sputtered atoms collide with any other objects or particles.

Finally, since a film forming apparatus according to the invention is additionally provided with substrate heating means arranged at the substrate electrode for heating the substrate or an RF bias power source for applying an RF bias voltage to the substrate electrode, the former added means serve to completely fill the fine pores of the substrate by reflowing of the formed film caused by the heated substrate whereas the latter added means operate to completely fill the fine pores of the substrate by applying a bias voltage.

The present invention will now be described by way of example with reference to the accompanying drawings:

BRIEF DESCRIPTION OF THE DRAWINGS

FIG. 1-B is an enlarged sectional view of part of a substrate in a conventional sputtering apparatus, showing how a fine pore is incompletely filled with target atoms;

FIG. 1-C is an enlarged sectional view of part of a substrate in a conventional sputtering apparatus, showing how a fine pore is incompletely filled with target atoms if the deposited film is heated and caused to reflow;

FIG. 1-D is an enlarged sectional view of part of a substrate in a conventional sputtering apparatus, showing how a fine pore is incompletely filled with target atoms if RF bias is applied to the substrate;

FIG. 2-B is an enlarged sectional view of part of a substrate, showing the relationship between the angle of incidence of an atom and the size of a fine pore of the substrate;

DETAILED DESCRIPTION

Figure 3:
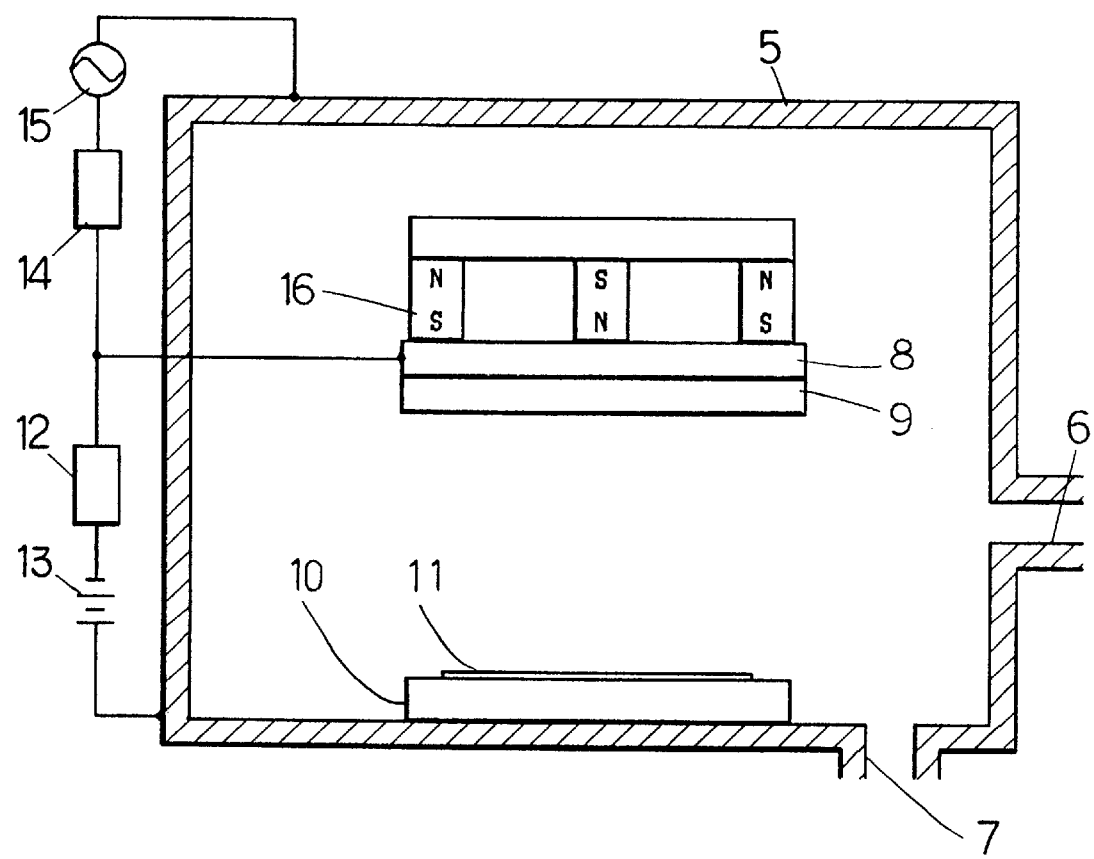
FIG. 3 is a schematic sectional view of a first embodiment of the invention, showing only its principal portions.

Referring to FIG. 3 that schematically illustrates a first embodiment of the invention, 5 denotes a vacuum chamber and is provided with a discharge gas inlet 6 and an evacuation opening 7. A target electrode 8 on which a target 8 is mounted and a substrate holder 10 on which a substrate 11 is mounted are arranged oppositely in the vacuum chamber 5. The target electrode 9 is connected through an RF filter 12 to a DC power source 13 and through a matching circuit 14 to an RF power source 15. A magnet 16 is disposed on the backside of the target electrode 8.

In the embodiment of FIG. 3, the target 9 and the substrate 11 have respective diameters of 250 mm and 150 mm and are separated from each other by a distance between 300 mm and 1,000 mm, which is greater than the diameter of the substrate 11, or 150 mm. The inside of the vacuum chamber 5 is evacuated through the evacuation opening 7 by means of a vacuum pump (not shown) to reduce the internal pressure and argon gas is fed into the chamber 5 through the discharge gas inlet 6 by controlling both the rate of evacuation and that of gas supply in such a way that the internal pressure of the vacuum chamber is constantly held to 2 to $5 \times 10^{-2}$ Pa. The target electrode 8 is supplied with a DC negative voltage of approximately 400V and an electric current of approximately 10A by the DC power source 13 and with RF electric power of 100 MHz and 1.5 KW by the RF power source 15.

An apparatus having a configuration as described above and illustrated in FIG. 3 operates in a following manner.

Combined RF-DC bias generates magnetron discharge to accelerate the rate of ionization of atmospheric gas, or argon gas, in the vacuum chamber 5. The moving speed of ionized argon gas is accelerated by the negative voltage applied to the target electrode 8 and they eventually strike the target 9 to sputter atoms on the surface of the target 9. The driven out atoms fly away in different directions according to the cosine rule and some of them will deposit on the substrate 11 to form a thin film. If the distance between the target. 9 and the substrate 11 is 1,000 mm, the angle of incidence $\theta$ of target atoms striking the substrate 11 will be approximately 85.

Since the internal pressure of the vacuum chamber 5 during the sputtering operation is sufficiently low, the mean free path of target atoms is made long to lower the probability with which they collide with molecules of gas in the vacuum chamber 5 is reduced to in turn raise the probability with which atoms approaching the substrate 11 along a direction perpendicular to it come to hit it directly so that less atoms may settle at and near the opening of each pore of the substrate 11, while more atoms become apt to deposit on the bottom of each pore to produce a film thickness substantially equal to the film thickness on the surface of the substrate.

The table below shows the rate of forming a film that varies as a function of the distance between the target 9 and the substrate 11 for both a conventional sputtering apparatus where the atmospheric pressure in the vacuum chamber 5 is held to $3 \times 10^{-1}$ Pa and the film forming apparatus according to the invention where the atmospheric pressure is held to $3 \times 10^{-2}$ Pa.

| distance | $3 \times 10^{-1}$ Pa | $3 \times 10^{-2}$ Pa |
|---|---|---|
| 77 mm | 5,600 Å /min. | 4,000 Å /min. |
| 300 mm | 500 Å /min. | 1,000 Å /min. |
| 1.050 mm | 1 Å /min. | 35 Å /min. |

As seen from the table above, the rate of forming a film in a conventional apparatus does not substantially differ from the rate in a film forming apparatus according to the invention because the mean free path of atoms under the atmospheric pressure of $3 \times 10^{-1}$ Pa is not far from that of their counterparts under $3 \times 10^{-2}$ Pa when the distance between the target 9 and the substrate 11 is 77 mm (this represents an ordinary sputtering apparatus).

To the contrary, the mean free path of atoms under $3 \times 10^{-1}$ Pa is sufficiently large when the target 9 is separated from the substrate 11 by 300 mm and therefore target atoms driven out of the target 9 can be dispersed by far more than their counterparts under $3 \times 10^{-2}$ Pa so that the rate of forming a film by the former atoms will be substantially lower than that by the latter atoms.

Since the pressure in the vacuum chamber of the film forming apparatus according to the invention is held low, atoms sputtered from the target are less hindered by gas molecules in the atmosphere and apt to hit the substrate 11 along a direction substantially perpendicular to the surface of the substrate 11.

Figure 4:
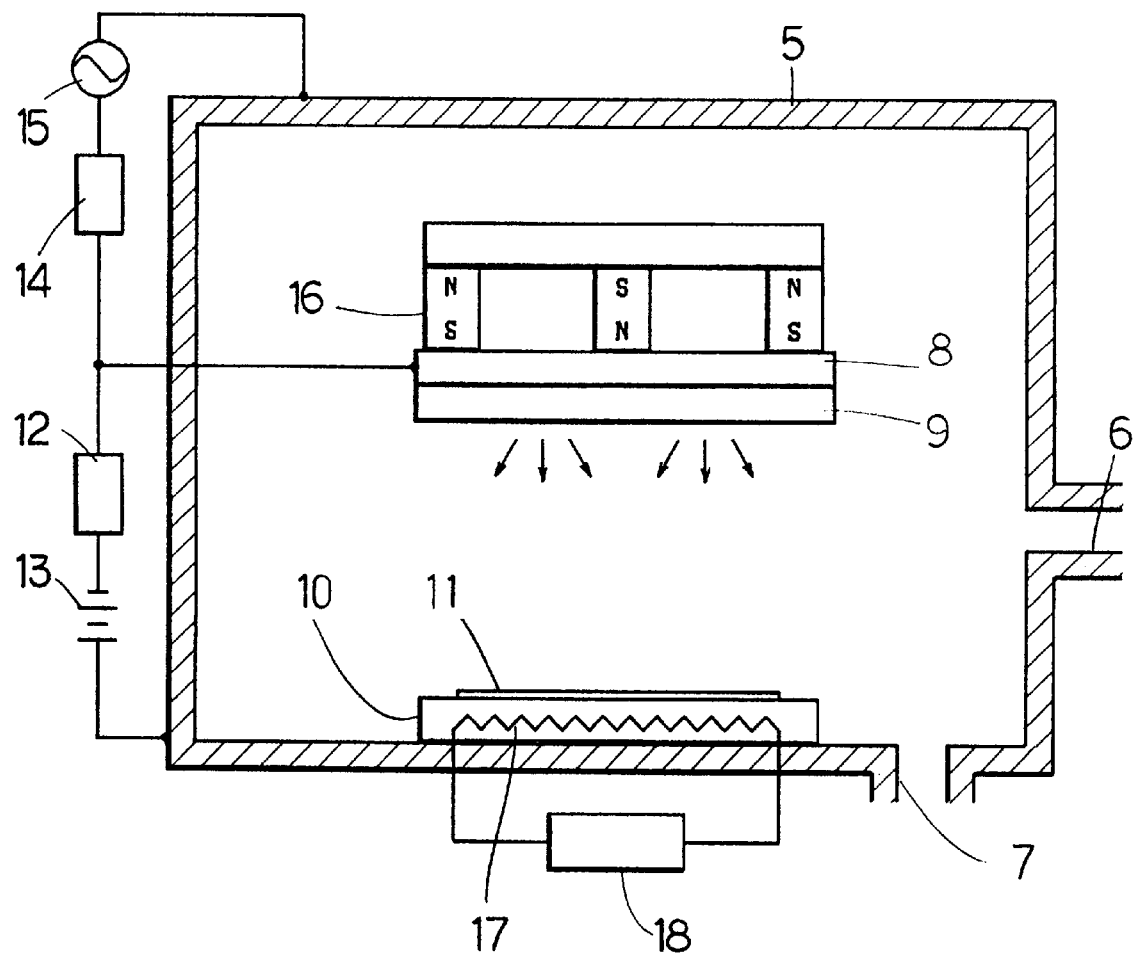
FIG. 4 is a schematic sectional view of a second embodiment of the invention, showing only its principal portions.

FIG. 4 schematically illustrates a second embodiment of the invention and their components corresponding to their respective counterparts of the first embodiment are respectively indicated by the same reference numerals. In the second embodiment, a heater 17 for heating the substrate 11 is incorporated into the substrate holder 10 in order to cause the film deposited on the surface and in the pores of the substrate 11 to reflow and completely fill each pore. The heater 17 is energized by an external power source 18 arranged for the heater 17.

Figure 5:
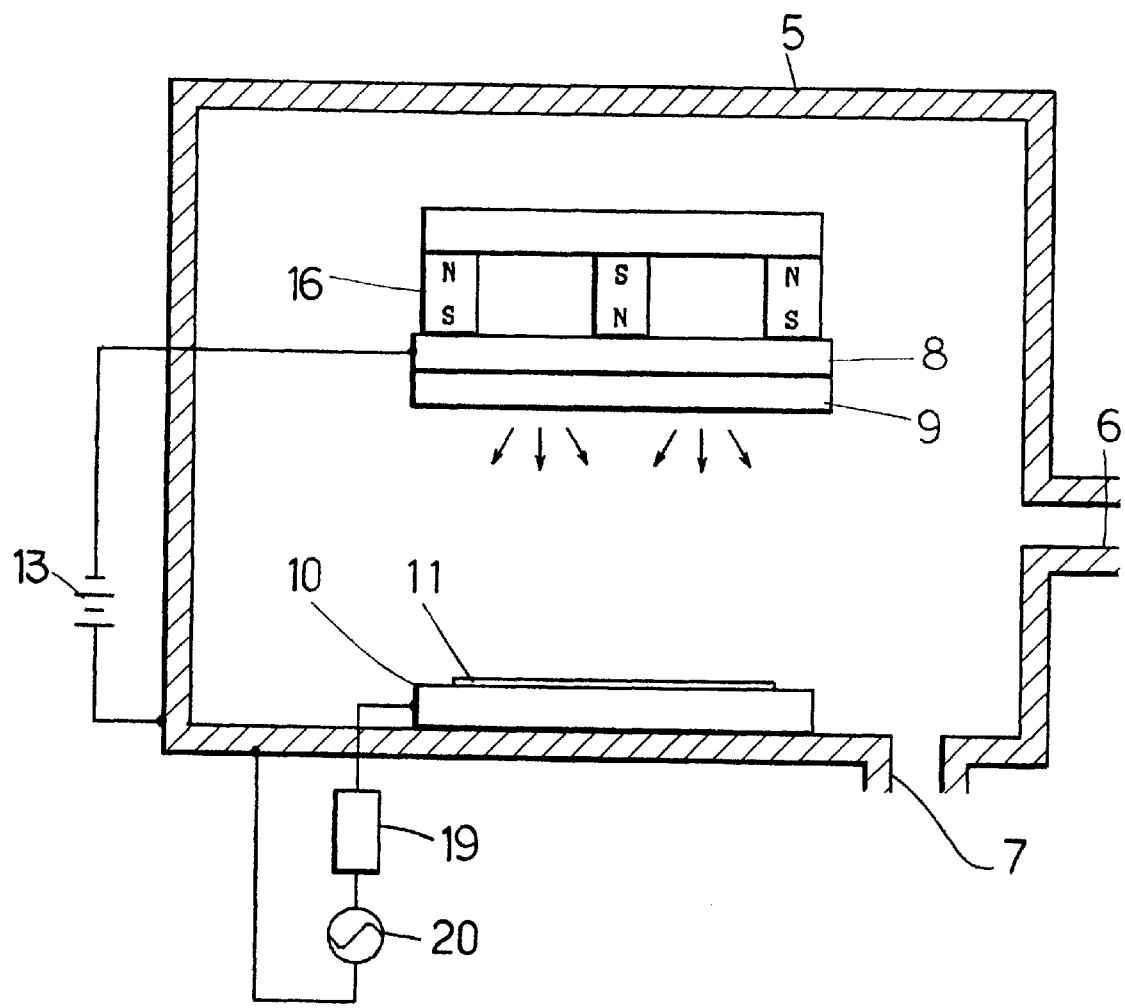
FIG. 5 is a schematic sectional view of a third embodiment of the invention, showing only its principal portions.

FIG. 5 schematically illustrates a third embodiment of the invention and their components corresponding to their respective counterparts of the first embodiment are respectively indicated by the same reference numerals. In the third embodiment, a bias voltage is applied to the substrate holder 10 so that each pore of the substrate 11 may be completely filled with target atoms. The substrate holder 10 is connected through a matching circuit 19 to an RF bias power source 20 so that the substrate 11 may be energized by RF power.

Figure 6A:
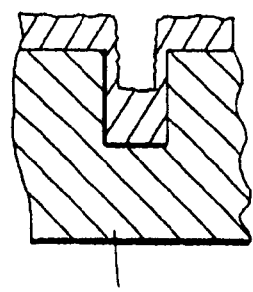
FIG. 6 is enlarged sectional view of part of a substrate and a pore, wherein A shows a view when the pore is being filled with target atoms and B shows a view when the pore is completely filled and does not have any void space.
Figure 6B:
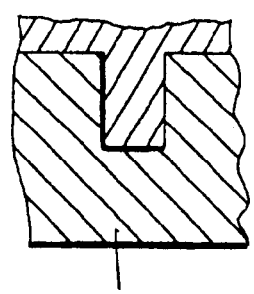

FIGS. 6-A and 6-B schematically illustrate in cross section how a pore is filled with target atoms by means of any of the above described embodiments. FIG. 6-A shows a view when the pore is being filled with target atoms whereas FIG. 6-B shows a view when the pore is completely filled and does not have any void space.

Figure 1A:
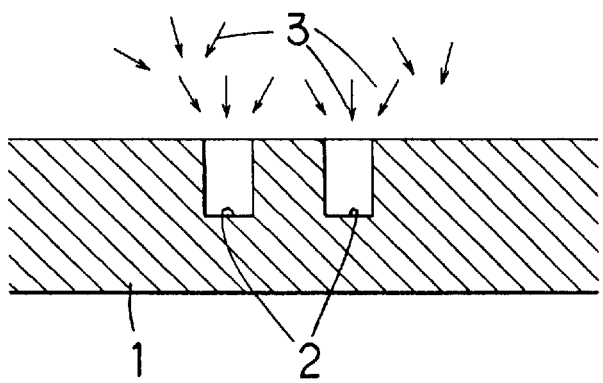
FIG. 1-A is an enlarged sectional view of part of a substrate in a conventional sputtering apparatus, showing target atoms flying toward fine pores of the substrate.
Figure 1B:
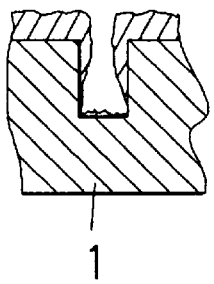
Figure 1C:
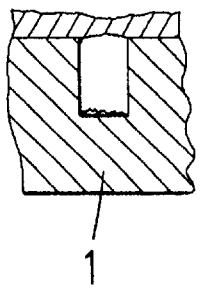
Figure 1D:
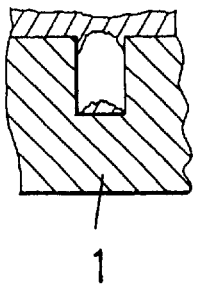
Figure 2A:
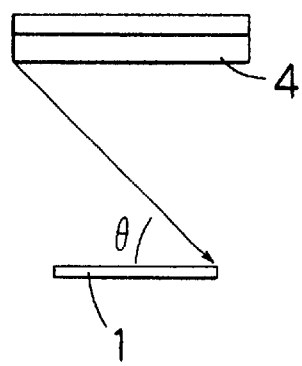
FIG. 2-A is a schematic front view of a substrate, showing the track of an atom driven out of the target and striking the substrate with the smallest possible angle of incidence.
Figure 2B:
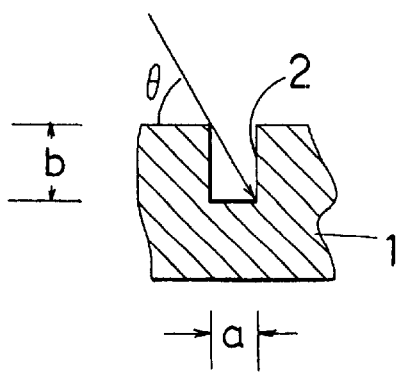

While the embodiments of FIGS. 1 and 2 are designed for combined RF-DC sputtering, they may be so modified as to be feasibly used with any other sputtering technique so long as the modified apparatus can conduct electric discharge in an atmospheric pressure lower than $1 \times 10^{-1}$ Pa.

As described above in detail for the film forming apparatus according to the invention, since the distance between the target and the substrate is made greater than the diameter of the substrate or a relationship of $b/a \leq \tan \theta$ is held true in the vacuum chamber, where a, b and $\theta$ respectively represent the diameter and the depth of each pore of the substrate and the angle of incidence of each target atom driven out of the target to hit the substrate, and the internal pressure of the vacuum chamber is held to be not higher than $1 \times 10^{-1}$ Pa, the sputtered atoms show a long mean free path and therefore the probability with which they collide with other objects before they get to the substrate is held low so that consequently the probability with which atoms driven out of the target strike the substrate along a direction perpendicular to, the surface of the substrate is raised. Thus, less atoms settle at and near the opening of each fine pore and more atoms deposit on the bottom of the pore to effectively fill fine pores of a substrate.

Furthermore, with the film forming apparatus according to the invention, fine pores of a substrate can be completely filled with target atoms without forming void spaces if the substrate is heated to cause the formed film to reflow or RF bias is applied thereto.

It is to be understood that the above-mentioned embodiments are only illustrative of the application of the principles of the present invention. Numerous modifications and alterations may be made by those skilled in the art without departing from the spirit and scope of the invention, and the appended claims are intended to cover such modifications and alterations.

What is claimed is:

1. A magnetron sputtering apparatus for filling pores of a substrate wherein the apparatus comprises a vacuum chamber to be evacuated which has an internal gas pressure level held at not higher than $1 \times 10^{-1}$ Pa, means for introducing discharge gas into the vacuum chamber, target and substrate electrodes arranged opposite one another in the vacuum chamber and respectively mounted with a target and the substrate, said target and the substrate being separated from each other with a distance more than 77 mm and greater than the diameter of the substrate, and a magnet provided on a side of the target electrode away from the substrate electrode.

2. A magnetron sputtering apparatus for filling pores of a substrate comprising a vacuum chamber to be evacuated which has an internal gas pressure level held at not higher than $1 \times 10^{-1}$ Pa, means for introducing discharge gas into the vacuum chamber, target and substrate electrodes arranged opposite one another in the vacuum chamber and respectively mounted with a target and the substrate arranged to hold a relationship of $b/a < \tan \theta$, a, b and $\theta$ respectively representing the diameter and the depth of each pore of the substrate and the angle of incidence of each target atom driven out of the target to hit the substrate, said target and the substrate being separated from each other with a distance more than 77 mm, and a magnet provided on a side of the target electrode away from the substrate electrode.

* * * * *